(12) United States Patent
Mai

(10) Patent No.: US 9,190,568 B2
(45) Date of Patent: Nov. 17, 2015

(54) LIGHT EMITTING DIODE STRUCTURE

(71) Applicant: Lextar Electronics Corporation, Hsinchu (TW)

(72) Inventor: Shih-Ching Mai, Pingzhen (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/272,532

(22) Filed: May 8, 2014

(65) Prior Publication Data

US 2015/0069406 A1 Mar. 12, 2015

(30) Foreign Application Priority Data

Sep. 12, 2013 (TW) .............................. 102133012 A

(51) Int. Cl.
*H01L 31/0256* (2006.01)
*H01L 33/20* (2010.01)
*H01L 33/14* (2010.01)

(52) U.S. Cl.
CPC .............. *H01L 33/20* (2013.01); *H01L 33/145* (2013.01)

(58) Field of Classification Search
CPC ........ H01L 33/38; H01L 33/145; H01L 33/20
See application file for complete search history.

(56) References Cited

U.S. PATENT DOCUMENTS

| | | | |
|---|---|---|---|
| 5,048,035 A | 9/1991 | Sugawara et al. | |
| 5,821,569 A * | 10/1998 | Dutta | 257/96 |
| 6,377,598 B1 | 4/2002 | Watanabe et al. | |
| 6,583,443 B1 | 6/2003 | Chang et al. | |
| 8,338,819 B2 | 12/2012 | Lu et al. | |
| 2002/0104996 A1* | 8/2002 | Kuo et al. | 257/79 |
| 2009/0026927 A1* | 1/2009 | Choi et al. | 313/504 |
| 2010/0167434 A1* | 7/2010 | Fang et al. | 438/22 |
| 2011/0095332 A1* | 4/2011 | Hwang et al. | 257/103 |
| 2011/0254035 A1* | 10/2011 | Kim et al. | 257/98 |

FOREIGN PATENT DOCUMENTS

| | | |
|---|---|---|
| TW | 513820 B | 12/2002 |
| TW | 200939548 | 9/2009 |
| TW | 201133937 A1 | 10/2011 |

OTHER PUBLICATIONS

TW Office Action dated Aug. 8, 2013 in corresponding Taiwan application (No. 102133012).

* cited by examiner

*Primary Examiner* — Victor A Mandala
(74) *Attorney, Agent, or Firm* — McClure, Qualey & Rodack, LLP

(57) ABSTRACT

A light emitting diode structure comprising a substrate, a first semiconductor layer, an active layer, a second semiconductor layer, a current resisting layer, a current spreading layer, a first electrode and a second electrode is provided. The first semiconductor layer is formed on the substrate. The active layer covers a portion of the first semiconductor layer, and exposes another portion of the first semiconductor layer. The second semiconductor layer is formed on the active layer. The current resisting layer covers a portion of the second semiconductor layer, and exposes another portion of the second semiconductor layer. The current spreading layer covers the second semiconductor layer and the current resisting layer. The current spreading layer is formed with a reverse trapezoidal concave over the current resisting layer. The first electrode is disposed on the first semiconductor layer. The second electrode is disposed within the reverse trapezoidal concave.

11 Claims, 2 Drawing Sheets

LIGHT EMITTING DIODE STRUCTURE

This application claims the benefit of Taiwan application Serial No. 102133012, filed Sep. 12, 2013, the subject matter of which is incorporated herein by reference.

BACKGROUND OF THE INVENTION

1. Field of the Invention

The invention relates in general to a light emitting diode structure, and more particularly to a light emitting diode structure capable of increasing current spreading effect.

2. Description of the Related Art

The light-emitting diode (LED) emits a light by converting electric energy into photo energy. The LED is mainly composed of semiconductors. Of the semiconductors, that having a larger ratio of holes carrying positive electricity is referred as P type semiconductor, and that having a larger ratio of electrons carrying negative electricity is referred as N type semiconductor. The junction connecting a P type semiconductor and an N type semiconductor forms a PN junction. When a voltage is applied to a positive polarity and a negative polarity of an LED chip, the electrons and the holes will be combined and then emit energy in a form of light.

In addition, the light intensity of LED is related to a current density of a voltage applied thereto. In general, the light intensity increases with the increase in the current density. However, it is not easy to increase the luminous efficiency and at the same time make the current uniformly spread. In a conventional art, the current can be uniformly spread by increasing areas of the electrodes. By doing so, the light-shading area of the electrodes would be increased and the luminous efficiency deteriorates accordingly. Conversely, if the luminous efficiency is increased by reducing the light-shading area of the electrodes, the current is crowded and cannot be spread uniformly and the effect of thermal concentration will be worsened. Therefore, how to make the current density uniformly distributed without affecting the light intensity has become a prominent task for the industries.

SUMMARY OF THE INVENTION

The invention is directed to a light emitting diode structure for increasing current spreading effect.

According to one embodiment of the present invention, a light emitting diode structure is provided. The light emitting diode structure comprises a substrate, a first semiconductor layer, an active layer, a second semiconductor layer, a current resisting layer, a current spreading layer, a first electrode and a second electrode. The first semiconductor layer is formed on the substrate. The active layer covers a portion of the first semiconductor layer, and exposes another portion of the first semiconductor layer. The second semiconductor layer is formed on the active layer. The current resisting layer covers a portion of the second semiconductor layer, and exposes another portion of the second semiconductor layer. The current spreading layer covers the second semiconductor layer and the current resisting layer. The current spreading layer is formed with a reverse trapezoidal concave over the top of the current resisting layer by an etching process. The first electrode is disposed on the first semiconductor layer. The second electrode is disposed within the reverse trapezoidal concave.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the light emitting diode structure of the invention, a current spreading layer is formed over a current resisting layer. For example, the current resisting layer is an N-type semiconductor layer, and the current spreading layer is a P-type semiconductor layer. In relation to the holes, the energy gap of the current resisting layer is greater than the energy gap of the current spreading layer. When a current is infused to the light emitting structure via an electrode (such as a P-type electrode), the current, being blocked by the current resisting layer, is uniformly spread on the current spreading layer, so that the current crowding effect occurring under the electrode is retarded.

In addition, the current spreading layer forms a reverse trapezoidal concave over the top of the current resisting layer (referring to FIG. 1), and the electrode is disposed within the reverse trapezoidal concave. In comparison to a planar electrode, the reverse trapezoidal electrode having 3D (three dimensions) contact with the electrode contacting layer provides a larger contact area by which the current is more uniformly spread and the light emitting efficiency is increased. In comparison to the conventional planar electrode, the electrode of the present embodiment has a reduced light shading area at the bottom, such that the light flux emitted at an oblique angle is increased and the luminous efficiency of the light emitting diode is enhanced.

A number of embodiments are disclosed below for elaborating the invention. However, the embodiments of the invention are for detailed descriptions only, not for limiting the scope of protection of the invention.

Figure 1:
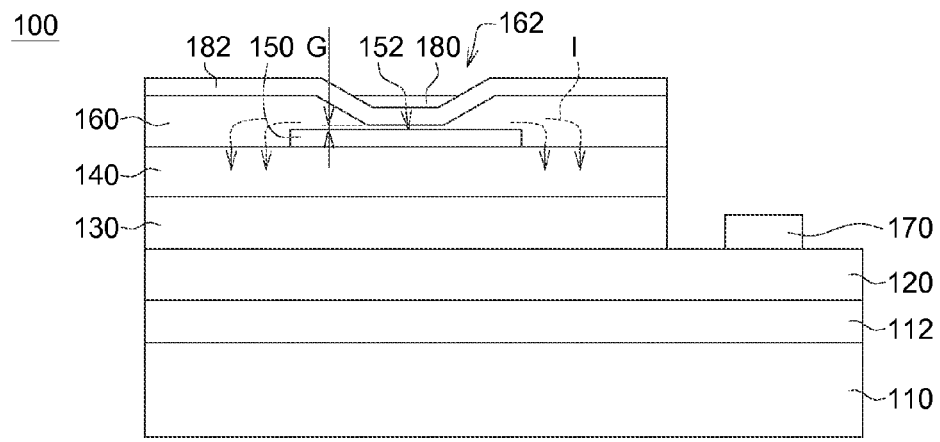
FIG. 1 is a schematic diagram of a light emitting diode structure according to an embodiment of the invention.

Referring to FIG. 1, a schematic diagram of a light emitting diode structure 100 according to an embodiment of the invention is shown. The light emitting diode structure 100 comprises a substrate 110, a first semiconductor layer 120, an active layer 130, a second semiconductor layer 140, a current resisting layer 150, a current spreading layer 160, a first electrode 170 and a second electrode 180. For example, the first semiconductor layer 120 is an N-type semiconductor layer, and the second semiconductor layer 140 is a P-type semiconductor layer. The first electrode 170 is an N-type electrode disposed on the first semiconductor layer 120, and the second electrode 180 is a P-type electrode which can be directly formed on the current spreading layer 160 or disposed on the current spreading layer 160 through an electrode contacting layer 182.

In the present embodiment, the electrode contacting layer 182 is preferably formed between the current spreading layer 160 and the second electrode 180 to reduce the contact resistance between the second electrode 180 and the current spreading layer 160. However, the electrode contacting layer 182 is only an exemplary implementation of the invention, and the present invention does not have particular restrictions imposed thereon.

The first semiconductor layer 120 is formed on the substrate 110. The substrate 110 is a sapphire substrate or a silicon substrate, for example. The first semiconductor layer 120 can be directly formed on the substrate 110 or disposed on the substrate 110 through a buffer layer 112.

The active layer 130 covers a portion of the first semiconductor layer 120, and exposes a portion of the first semiconductor layer 120. The second semiconductor layer 140 is formed on the active layer 130, and the first electrode 170 is disposed on the exposed portion of the first semiconductor layer 120. The first semiconductor layer 120, the active layer 130 and the second semiconductor layer 140 are formed by a nitride composed of elements from group IIIA of the periodic table. For instance, the first semiconductor layer 120, the active layer 130 and the second semiconductor layer 140 are formed by a material selected from one or a combination of the groups composed of gallium nitride (GaN), indium gallium nitride (InGaN), aluminum gallium nitride (AlGaN) or aluminum indium gallium nitride (AlInGaN).

The current resisting layer 150 covers a portion of the second semiconductor layer 140, and exposes a portion of the second semiconductor layer 140. For instance, the current resisting layer 150 covers the central portion of the second semiconductor layer 140 and exposes at least a peripheral portion (or all peripheral portions) of the second semiconductor layer 140. The current resisting layer 150 can be formed by a nitride, an oxide or a carbide, or a highly-resistant material such as silicon nitride, silica or silicon carbide to avoid the current concentrating under the second electrode 180 and causing current crowding effect.

The current spreading layer 160 covers the second semiconductor layer 140 and the current resisting layer 150. For instance, the current spreading layer 160 covers the current resisting layer 150 at the central position of the second semiconductor layer 140 and a peripheral portion of the second semiconductor layer 140. The current spreading layer 160 has a lower doping concentration so that the current can be more uniformly spread before entering the second semiconductor layer 14 having a lower resistance. In the present embodiment, the thickness of the current spreading layer 160 is reduced to avoid the loss of light output which may occur if the current spreading layer 160 is too thick and absorbs the light.

Figure 2:
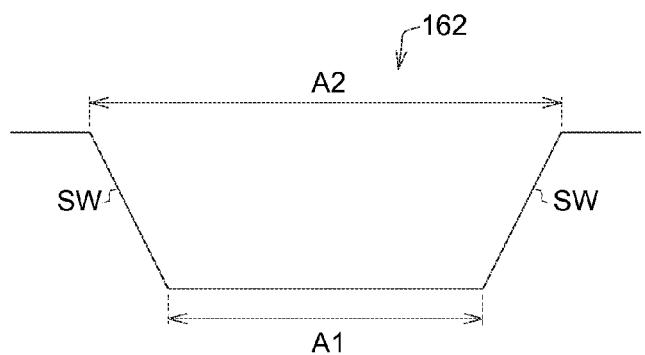
FIG. 2 is a schematic diagram of an opening area of a reverse trapezoidal concave.

The current spreading layer 160 is formed with a reverse trapezoidal concave 162 over the top of the current resisting layer 150. As indicated in FIG. 2, the opening area of the reverse trapezoidal concave 162 shrinks in a top down manner such that the opening area of the reverse trapezoidal concave 162 is increased to A2 from A1.

Figure 3A:
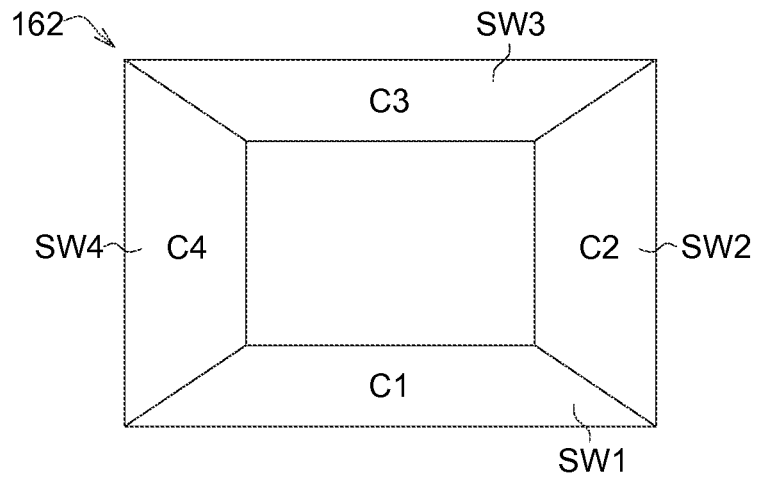
FIG. 3A is a top view of a reverse trapezoidal concave.
Figure 3B:
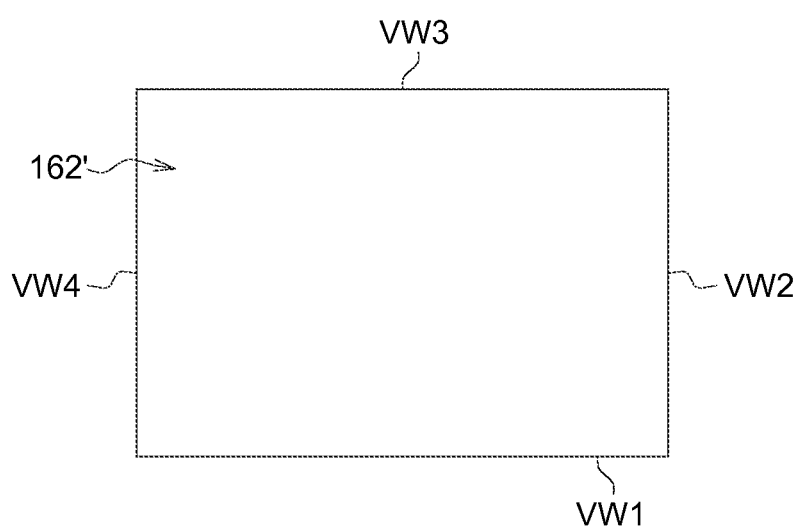
FIG. 3B is a top view of a recess comprising four vertical sidewalls.

Referring to FIG. 3A, a top view of a reverse trapezoidal concave 162 is shown. The reverse trapezoidal concave 162 has four inclined sidewalls SW1~SW4 with respective areas C1, C2, C3 and C4. When the second electrode 180 is disposed within the reverse trapezoidal concave 162, the second electrode 180 can contact the current spreading layer 160 by the four inclined sidewalls SW1-SW4 and the total contact area is equal to the sum of C1+C2+C3+C4. Suppose the concave 162 is not a reverse trapezoidal but a recess 162' comprising four vertical sidewalls VW1~VW4 as indicated in FIG. 3B. When the second electrode 180 is formed within the recess 162', the total contact area between the second electrode 180 and the current spreading layer 160 will be smaller than the sum of C1+C2+C3+C4. Therefore, through the use of the reverse trapezoidal concave 162 having inclined sidewalls SW, the contact area between the second electrode 180 and the current spreading layer 160 can be increased to provide better current spreading effect.

In comparison to a conventional planar electrode, the second electrode 180 of the present embodiment is a reverse trapezoid with a reduced light shading area at the bottom side. Since the light blocking area is reduced, the light flux emitted at an oblique angle is increased and the luminous efficiency of the light emitting diode is enhanced.

In the present embodiment, when the current I (referring to FIG. 1) is infused to the light emitting structure via the second electrode 180, the current I, being blocked by the current resisting layer 150, is spread towards the peripheral of the current spreading layer 160 first and then enters the second semiconductor layer 140 via the peripheral portion of the current spreading layer 160. By doing so, the current I is uniformly spread in the current spreading layer 160, and thus the current crowding effect occurring under the electrode is retarded.

As indicated in FIG. 1, the electrode contacting layer 182 and the reverse trapezoidal concave 162 form a conformal structure, such that the electrode contacting layer 182 conformably covers the surface of the current spreading layer 160 and the reverse trapezoidal concave 162. Meanwhile, the second electrode 180 is disposed on the electrode contacting layer 182 within the reverse trapezoidal concave 162 to reduce the contact resistance between the second electrode 180 and the current spreading layer 160. In an embodiment, the surface 152 of the current resisting layers 150 is parallel and opposite to the bottom of the reverse trapezoidal concave 162, such that the current resisting layer 150 is separated from the reverse trapezoidal concave 162 by a minimum gap G.

In the present embodiment, the current resisting layer 150 may be a semiconductor layer containing N-type dopants, and the current spreading layer 160 may be a semiconductor layer containing P-type dopants. Preferably, the current resisting layer 150 is formed by an AlGaN semiconductor material having a large energy gap, such that the energy gap of the current resisting layer 150 is greater than the energy gap of the current spreading layer 160. Thus, the current will not be easily infused to the second semiconductor layer 140 via the current resisting layer 150, and the current spreading effect will be greatly increased.

The light emitting diode structure 100 disclosed in above embodiments, under high current operation, allows the current to be uniformly distributed without decreasing the luminous efficiency. Therefore, the light shading area of the electrode can be reduced to enhance the luminous efficiency, and the current crowding effect caused by an increase in current is reduced accordingly.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting diode structure, comprising:
   a substrate;
   a first semiconductor layer formed on the substrate;
   an active layer covering a portion of the first semiconductor layer and exposing another portion of the first semiconductor layer;
   a second semiconductor layer formed on the active layer;
   a current resisting layer covering a portion of the second semiconductor layer and exposing another portion of the second semiconductor layer;
   a current spreading layer covering the second semiconductor layer and the current resisting layer, wherein the current spreading layer is formed with a reverse trapezoidal concave over a top of the current resisting layer;

a first electrode disposed on the first semiconductor layer; and a second electrode disposed within the reverse trapezoidal concave.

2. The semiconductor light emitting structure according to claim 1, further comprising an electrode contacting layer conformably covering the surface of the current spreading layer and the reverse trapezoidal concave, such that the second electrode is disposed on the electrode contacting layer within the reverse trapezoidal concave.

3. The semiconductor light emitting structure according to claim 1, wherein the first semiconductor layer is an N-type semiconductor layer, and the second semiconductor layer is a P-type semiconductor layer.

4. The semiconductor light emitting structure according to claim 1, further comprising:

a buffer layer disposed between the substrate and the first semiconductor layer.

5. The semiconductor light emitting structure according to claim 1, wherein the current resisting layer is formed by a nitride, an oxide or a carbide.

6. The semiconductor light emitting structure according to claim 2, wherein the electrode contacting layer is formed by indium tin oxide (ITO) or indium zinc oxide (IZO).

7. The semiconductor light emitting structure according to claim 1, wherein the current resisting layer is a semiconductor layer containing N-type dopants.

8. The semiconductor light emitting structure according to claim 1, wherein the current spreading layer is a semiconductor layer containing P-type dopants.

9. The semiconductor light emitting structure according to claim 1, wherein an energy gap of the current resisting layer is greater than an energy gap of the current spreading layer.

10. The semiconductor light emitting structure according to claim 1, wherein the first semiconductor layer, the second semiconductor layer, the active layer are formed by a material selected from one or a combination of the groups composed of gallium nitride (GaN), indium gallium nitride (InGaN), aluminum gallium nitride (AlGaN) or aluminum indium gallium nitride (AlInGaN).

11. The semiconductor light emitting structure according to claim 1, wherein the current resisting layer is separated from the reverse trapezoidal concave by a gap.

\* \* \* \* \*